(12) United States Patent
Li

(10) Patent No.: US 12,261,202 B2
(45) Date of Patent: Mar. 25, 2025

(54) SEMICONDUCTOR HIGH-VOLTAGE DEVICE HAVING A BURIED GATE DIELECTRIC LAYER

(71) Applicant: UNITED MICROELECTRONICS CORP., Hsin-Chu (TW)

(72) Inventor: Shin-Hung Li, Nantou County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 452 days.

(21) Appl. No.: 17/577,386

(22) Filed: Jan. 18, 2022

(65) Prior Publication Data

US 2023/0215914 A1 Jul. 6, 2023

(30) Foreign Application Priority Data

Jan. 4, 2022 (CN) .......................... 202210001412.1

(51) Int. Cl.
*H01L 29/06* (2006.01)
*H01L 29/423* (2006.01)
*H01L 29/66* (2006.01)
*H01L 29/78* (2006.01)

(52) U.S. Cl.
CPC ...... *H01L 29/0653* (2013.01); *H01L 29/0619* (2013.01); *H01L 29/0692* (2013.01); *H01L 29/4236* (2013.01); *H01L 29/42364* (2013.01); *H01L 29/66621* (2013.01); *H01L 29/66704* (2013.01); *H01L 29/7823* (2013.01); *H01L 29/7825* (2013.01); *H01L 29/7834* (2013.01)

(58) Field of Classification Search
CPC ............. H01L 29/0619; H01L 29/0653; H01L 29/0692; H01L 29/4236; H01L 29/42364; H01L 29/66704; H01L 29/7816; H01L 29/7823; H01L 29/7825
See application file for complete search history.

(56) References Cited

U.S. PATENT DOCUMENTS

| | | | |
|---|---|---|---|
| 6,818,528 B2 | 11/2004 | Mandelman | |
| 9,741,850 B1 | 8/2017 | Hsiao | |
| 10,141,398 B1* | 11/2018 | Tsai | ..................... H01L 29/4916 |
| 10,276,710 B1* | 4/2019 | Li | ..................... H01L 29/42356 |
| 2009/0278208 A1* | 11/2009 | Chang | ............. H01L 21/823456 257/E27.06 |
| 2017/0345926 A1* | 11/2017 | Hsiao | .................. H01L 29/0653 |
| 2018/0114842 A1* | 4/2018 | Hsiao | ................ H01L 29/66545 |
| 2022/0093411 A1* | 3/2022 | Hsu | .................. H01L 29/42364 |
| 2022/0165864 A1* | 5/2022 | Lee | ..................... H01L 29/0642 |
| 2022/0209009 A1* | 6/2022 | Yang | ................. H01L 29/42368 |

* cited by examiner

*Primary Examiner* — Herve-Louis Y Assouman
*Assistant Examiner* — Christopher M Roland
(74) *Attorney, Agent, or Firm* — Winston Hsu

(57) ABSTRACT

A semiconductor high-voltage device includes a semiconductor substrate; a high-voltage well in the semiconductor substrate; a drift region in the high-voltage well; a recessed channel region adjacent to the drift region; a heavily doped drain region in the drift region and spaced apart from the recessed channel; an isolation structure between the recessed channel region and the heavily doped drain region in the drift region; a buried gate dielectric layer on the recessed channel region, wherein the top surface of the buried gate dielectric layer is lower than the top surface of the heavily doped drain region; and a gate on the buried gate dielectric layer.

9 Claims, 6 Drawing Sheets

SEMICONDUCTOR HIGH-VOLTAGE DEVICE HAVING A BURIED GATE DIELECTRIC LAYER

BACKGROUND OF THE INVENTION

1. Field of the Invention

The present invention relates generally to a semiconductor device, and more specifically, to a field-drift metal-oxide-semiconductor (FDMOS).

2. Description of the Prior Art

As metal-oxide semiconductor (MOS) transistors consume less power than traditional transistors and can be highly integrated, they are widely used in the semiconductor industry. When a proper voltage is inputted, MOS transistors can be used as a switch to control the flow of electricity through a device. In high voltage circuits, such as the input and output terminals of electrical equipment, field drift metal oxide semiconductor (FDMOS) transistors are commonly used because of their ability to withstand heavy loads.

However, the prior art FDMOS has several drawbacks. For example, the conventional FDMOS may have a parasitic field device that turns on as the operation voltage exceeds about 10V, leading to an unstable circuit model. As the development of integrated circuits progresses, improving field drift metal oxide semiconductor (FDMOS) transistors is an increasingly important issue.

SUMMARY OF THE INVENTION

It is one object of the present invention to provide an improved semiconductor high-voltage device to solve the above-mentioned deficiencies or shortcomings of the prior art.

One aspect of the invention provides a semiconductor high-voltage device including a semiconductor substrate of a first conductivity type; a high-voltage well of the first conductivity type disposed in the semiconductor substrate; a drift region of the second conductivity type disposed in the high-voltage well; a recessed channel region disposed adjacent to the drift region; a heavily doped drain region of the second conductivity type disposed in the drift region and spaced apart from the recessed channel region; an isolation structure disposed between the recessed channel region and the heavily doped drain region in the drift region; and a buried gate dielectric layer disposed on the recessed channel region. A top surface of the buried gate dielectric layer is lower than a top surface of the heavily doped drain region. A gate is disposed on the buried gate dielectric layer.

According to some embodiments, the isolation structure has a first thickness adjacent to the recessed channel region and a second thickness adjacent to the heavily doped drain region, and wherein the first thickness is greater than the second thickness.

According to some embodiments, a depth of the top surface of the buried gate dielectric layer below the top surface of the heavily doped drain region substantially equals to a difference between the first thickness and the second thickness.

According to some embodiments, the depth of the top surface of the buried gate dielectric layer below the top surface of the heavily doped drain region is about 500 angstroms.

According to some embodiments, the isolation structure is a shallow trench isolation structure.

According to some embodiments, the isolation structure is contiguous with the buried gate dielectric layer.

According to some embodiments, the drift region partially overlaps with the buried gate dielectric layer.

According to some embodiments, the semiconductor high-voltage device further includes an annular-shaped diffusion region of the first conductivity type surrounding the drift region, the recessed channel region, and the isolation structure.

According to some embodiments, the first conductivity is P type and the second conductivity type is N type.

According to some embodiments, the buried gate dielectric layer is a high-voltage gate oxide layer.

Another aspect of the invention provides a method of fabricating a semiconductor device. A semiconductor substrate of a first conductivity type is provided. A high-voltage well of the first conductivity type and a pre-recessed region are formed in the semiconductor substrate. A drift region of the second conductivity type is formed in the high-voltage well. A recessed channel region is formed adjacent to the drift region. A heavily doped drain region of the second conductivity type is formed in the drift region and spaced apart from the recessed channel region. An isolation structure is formed between the recessed channel region and the heavily doped drain region in the drift region. The isolation structure overlaps with the pre-recessed region. A buried gate dielectric layer is formed on the recessed channel region. A top surface of the buried gate dielectric layer is lower than a top surface of the heavily doped drain region. A gate is formed on the buried gate dielectric layer.

According to some embodiments, the isolation structure has a first thickness adjacent to the recessed channel region and a second thickness adjacent to the heavily doped drain region, and wherein the first thickness is greater than the second thickness.

According to some embodiments, a depth of the top surface of the buried gate dielectric layer below the top surface of the heavily doped drain region substantially equals to a difference between the first thickness and the second thickness.

According to some embodiments, the depth of the top surface of the buried gate dielectric layer below the top surface of the heavily doped drain region is about 500 angstroms.

According to some embodiments, the isolation structure is a shallow trench isolation structure.

According to some embodiments, the isolation structure is contiguous with the buried gate dielectric layer.

According to some embodiments, the drift region partially overlaps with the buried gate dielectric layer.

According to some embodiments, an annular-shaped diffusion region of the first conductivity type is formed in the semiconductor substrate. The annular-shaped diffusion region surrounds the drift region, the recessed channel region, and the isolation structure.

According to some embodiments, the first conductivity is P type and the second conductivity type is N type.

According to some embodiments, the buried gate dielectric layer is a high-voltage gate oxide layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
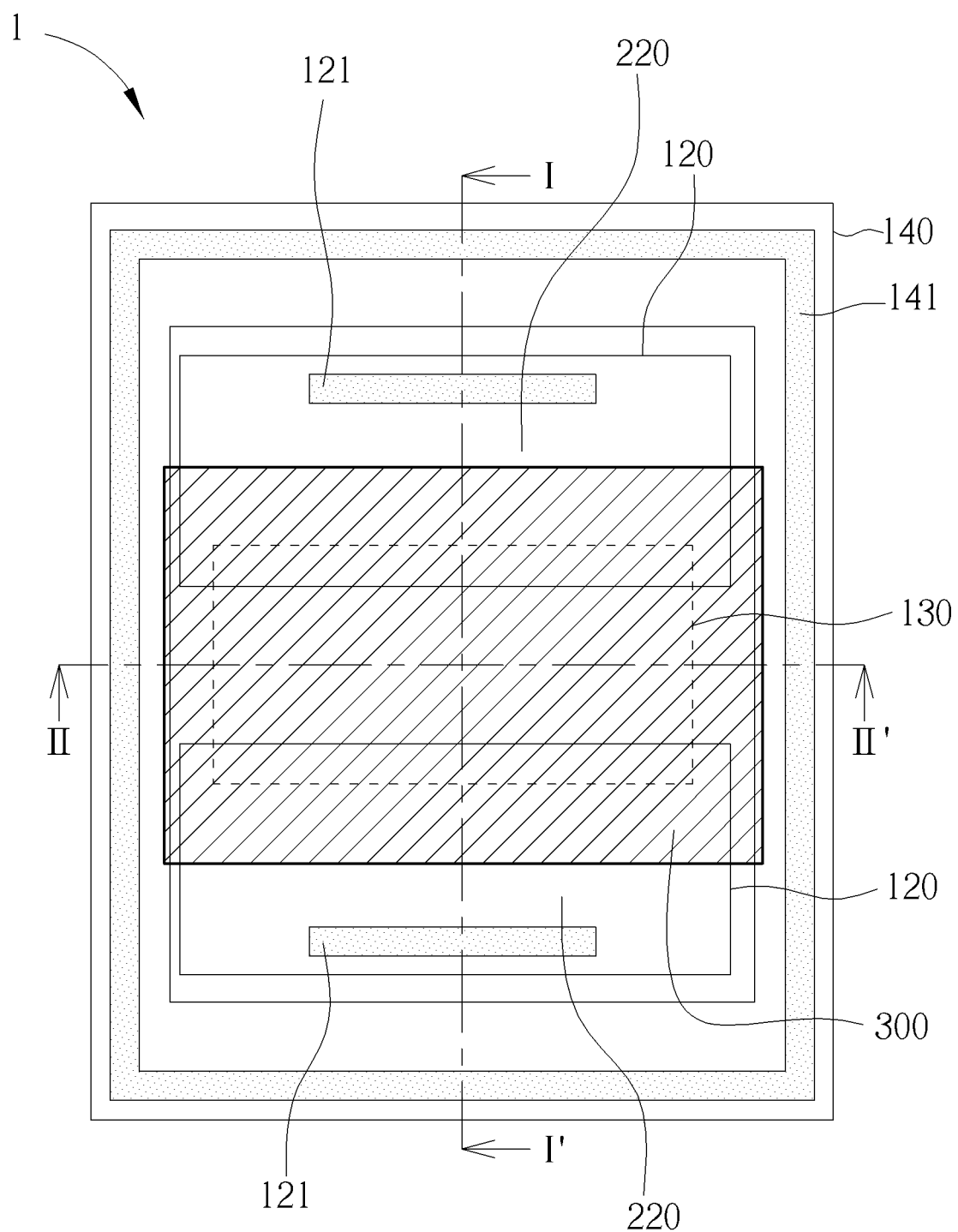
FIG. 1 is a schematic diagram of the layout of a semiconductor high-voltage device according to an embodiment of the present invention.
Figure 2:
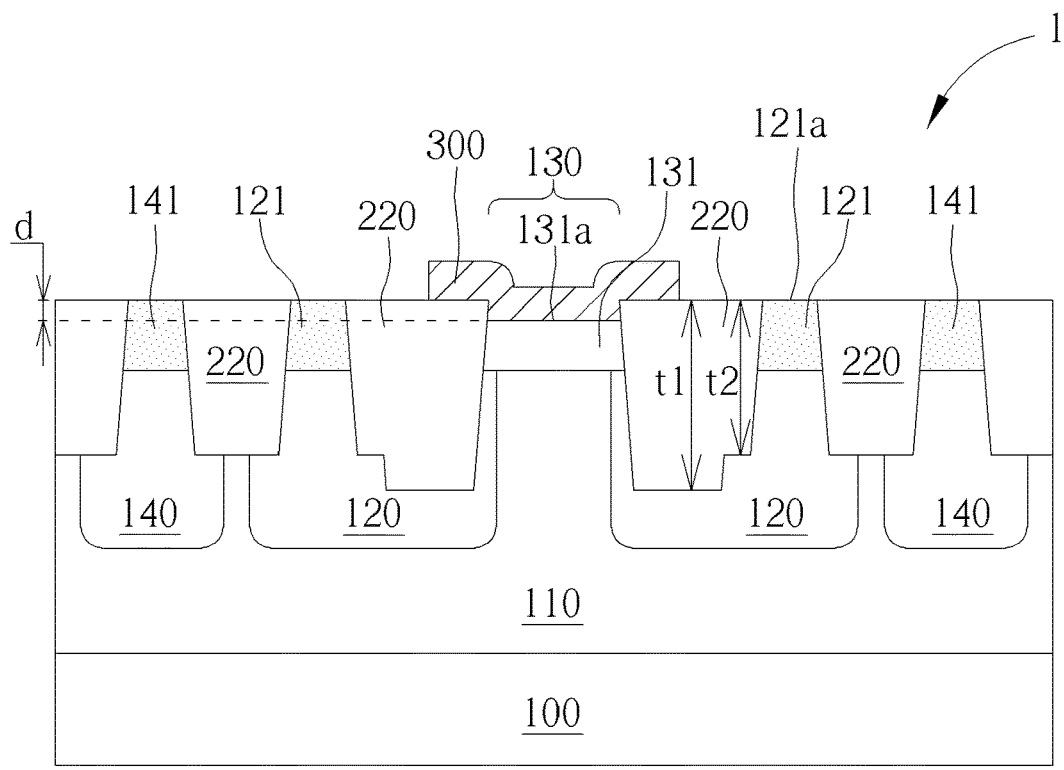
FIG. 2 is a schematic cross-sectional view taken along line I-I' in FIG. 1.
Figure 3:
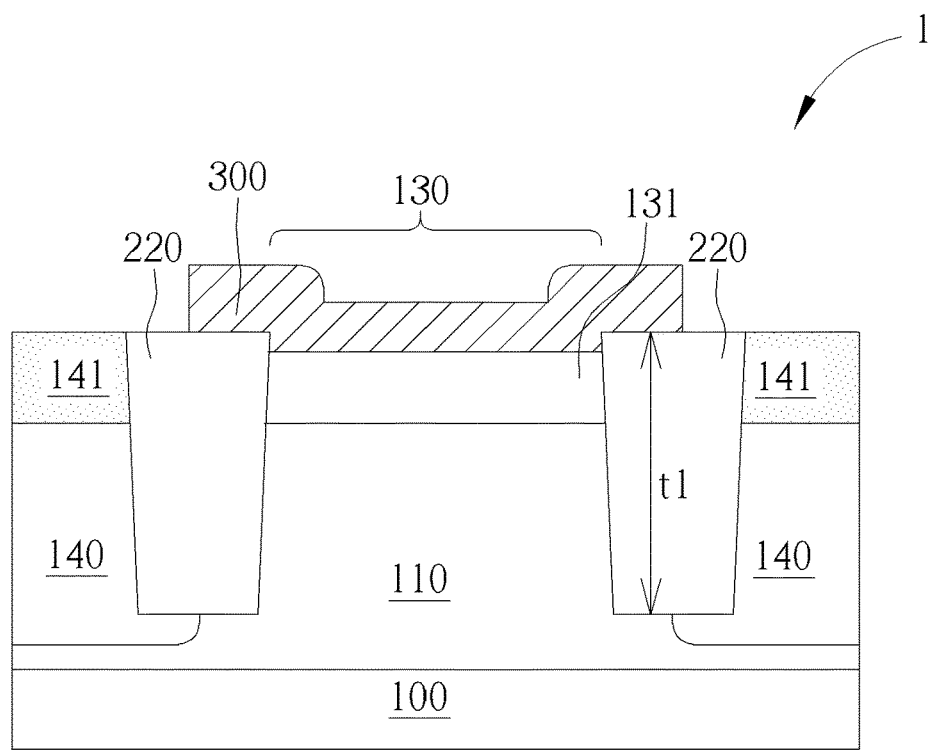
FIG. 3 is a schematic cross-sectional view taken along line II-II' in FIG. 1.

Please refer to FIG. 1 to FIG. 3. FIG. 1 is a schematic diagram of the layout of a semiconductor high-voltage device according to an embodiment of the present invention. FIG. 2 is a cross-sectional view taken along line I-I' (channel length direction) in FIG. 1. FIG. 3 is a schematic cross-sectional view taken along line II-II' (channel width direction) in FIG. 1. As shown in FIG. 1 to FIG. 3, the semiconductor high-voltage device 1, for example, a field-drift metal-oxide-semiconductor (FDMOS) transistor, includes a semiconductor substrate 100, for example, a silicon substrate, having a first conductivity type, for example, a P type. In the semiconductor substrate 100, a high-voltage well 110 is provided, which has a first conductivity type, for example, a P type. According to an embodiment of the present invention, a drift region 120 is provided in the high-voltage well 110 and has a second conductivity type, for example, an N-type.

According to an embodiment of the present invention, a recessed channel region 130 is provided on the semiconductor substrate 100 adjacent to the drift region 120. According to an embodiment of the present invention, the recessed channel region 130 may be an elongated area, but is not limited thereto. According to an embodiment of the present invention, as shown in FIG. 1 and FIG. 2, the recessed channel region 130 may partially overlap with the drift region 120. According to an embodiment of the present invention, heavily doped regions 121, for example, heavily doped drain regions, are disposed in the drift region 120 and spaced apart from the recessed channel region 130. The heavily doped regions 121 have the second conductivity type, for example, N type. According to an embodiment of the present invention, the heavily doped regions 121 are $N^+$ doped regions, which are disposed on two opposite sides of the recessed channel region 130 and used as the drain or source of the semiconductor high-voltage device 1.

According to an embodiment of the present invention, an isolation structure 220 is provided between the recessed channel region 130 and the heavily doped region 121.

According to an embodiment of the present invention, the isolation structure 220 is a shallow trench isolation (STI) structure. According to an embodiment of the present invention, generally, the isolation structure 220 surrounds the recessed channel region 130, and the isolation structure 220 between the recessed channel region 130 and the heavily doped region 121 overlaps the drift region 120. According to an embodiment of the present invention, the isolation structure 220 has a first thickness t1 adjacent to the recessed channel region 130 and a second thickness t2 adjacent to the heavily doped region 121, wherein the first thickness t1 is greater than the second thickness t2.

According to an embodiment of the present invention, a buried gate dielectric layer 131 is provided on the recessed channel region 130. The buried gate dielectric layer 131 may be a silicon dioxide layer, but is not limited thereto. According to an embodiment of the present invention, the buried gate dielectric layer 131 is a high-voltage gate oxide layer. According to an embodiment of the present invention, the isolation structure 220 is contiguous with the buried gate dielectric layer 131. According to an embodiment of the present invention, the drift region 120 partially overlaps with the buried gate dielectric layer 131.

According to an embodiment of the present invention, the top surface 131a of the buried gate dielectric layer 131 is lower than the top surface 121a of the heavily doped region 121. According to an embodiment of the present invention, the depth d of the top surface 131a of the buried gate dielectric layer 131 below the top surface 121a of the heavily doped region 121 equals to the difference between the first thickness t1 and the second thickness t2. According to an embodiment of the present invention, the depth d of the top surface 131a of the buried gate dielectric layer 131 below the top surface 121a of the heavily doped region 121 is about 500 angstroms. According to an embodiment of the present invention, a gate 300 is provided on the buried gate dielectric layer 131. The gate 300 may be a polysilicon gate, but is not limited thereto. According to an embodiment of the present invention, the gate 300 may extend to the isolation structure 220 around the recessed channel region 130.

According to an embodiment of the present invention, the semiconductor high-voltage component 1 further includes an annular diffusion region 141 disposed in the annular ion well 140, and has a first conductivity type, for example, a P-type. According to an embodiment of the present invention, the annular diffusion region 141 may be a $P^+$ doped region. The annular diffusion region 141 surrounds the drift region 120, the recessed channel region 130 and the isolation structure 220. According to an embodiment of the present invention, the thickness of the isolation structure 220 located between the annular diffusion region 141 and the heavily doped region 121 is equal to the second thickness t2, as shown in FIG. 2. According to an embodiment of the present invention, as shown in FIG. 3, the thickness of the isolation structure 220 between the annular diffusion region 141 and the recessed channel region 130 is equal to the first thickness t1.

The structural feature of the present invention is that the top surface 131a of the buried gate dielectric layer 131 is lower than the top surface 121a of the heavily doped region 121, and the isolation structure 220 has a first thickness t1 adjacent to the recessed channel region 130 and a second thickness t2 adjacent to the heavily doped region 121, wherein the first thickness t1 is greater than the second thickness t2, so that the threshold voltage of the parasitic field device can be increased without affecting the operating performance of the semiconductor high voltage device 1, thereby improving the electrical properties of the semiconductor high-voltage component 1 and the stability during high-voltage operation.

Figure 4:
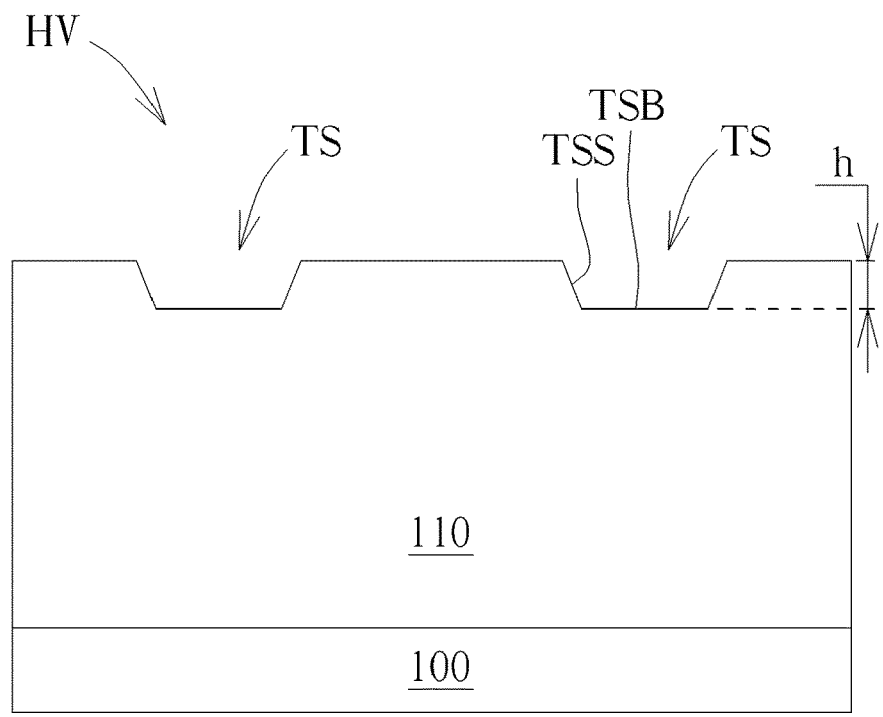
FIG. 4 to FIG. 11 are schematic diagrams showing a manufacturing method of semiconductor high-voltage devices according to an embodiment of the present invention.

Please refer to FIG. 4 to FIG. 11, which are schematic diagrams showing a method for manufacturing a semiconductor high-voltage device according to an embodiment of the present invention. As shown in FIG. 4, first, a semiconductor substrate 100, for example, a silicon substrate, is provided with a first conductivity type, for example, a P type. Next, a pre-recessed region TS is formed on the surface of the high-voltage device region HV of the semiconductor substrate 100 by a lithography process and an etching process. The depth h of the pre-recessed region TS is, for example, about 500 angstroms. According to an embodiment of the present invention, the pre-recessed region TS may have a flat bottom surface TSB and inclined sidewalls TSS.

According to an embodiment of the present invention, the pre-recessed region TS formed on the surface of the high-voltage element region HV can be fabricated simultaneously with the high-voltage well alignment trench or 00 alignment trench. Therefore, no additional photomask is required. According to an embodiment of the present invention, the range of the pre-recessed region TS is approximately the area of the gate 300 in FIG. 1 that does not overlap the recessed channel region 130. According to an embodiment of the present invention, a high-voltage well 110 may be formed in the semiconductor substrate 100. According to an embodiment of the present invention, the high-voltage well 110 has a first conductivity type, for example, P type.

Figure 5:
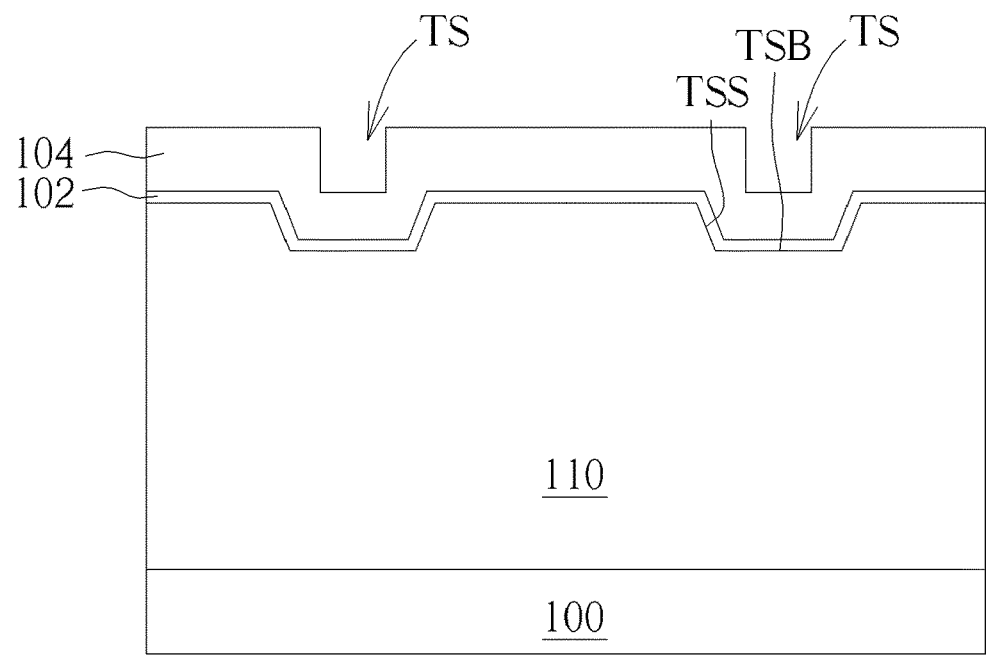

As shown in FIG. 5, next, a silicon oxide pad layer 102 and a silicon nitride pad layer 104 are sequentially formed on the surface of the semiconductor substrate 100. According to an embodiment of the present invention, the silicon oxide pad layer 102 and the silicon nitride pad layer 104 cover the pre-recessed region TS in a conformal manner.

Figure 6:
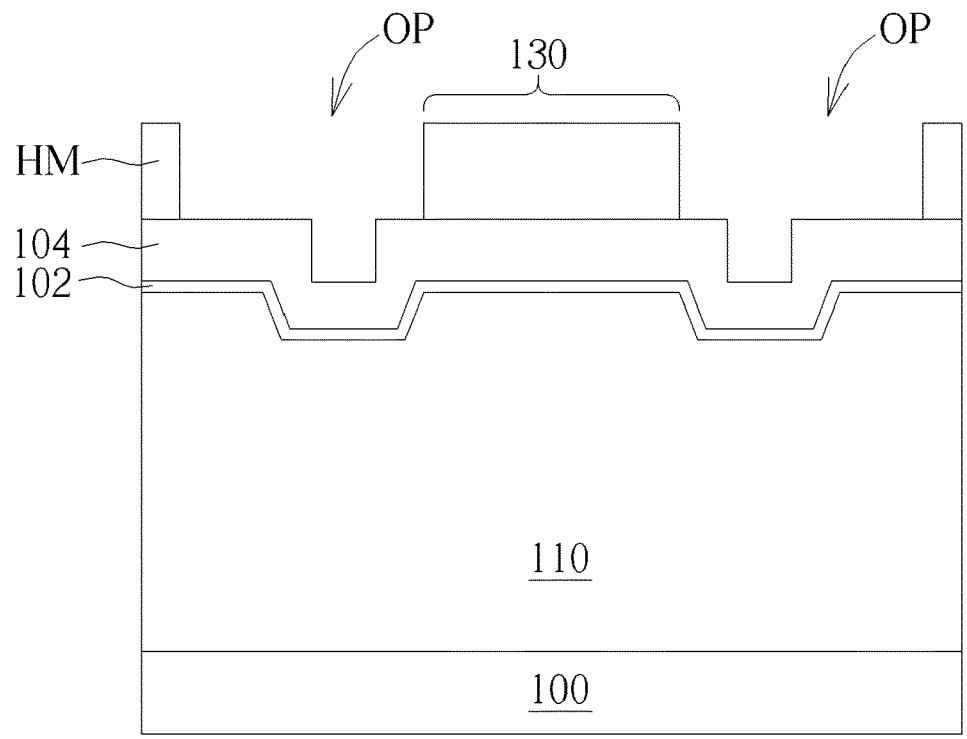

As shown in FIG. 6, next, a hard mask pattern HM is formed on the silicon nitride pad layer 104 to define a device isolation region. The hard mask pattern HM includes an opening OP defining a predetermined surface area of the semiconductor substrate 100 on which a shallow trench isolation (STI) structure is to be formed. According to an embodiment of the present invention, the opening OP covers the pre-recessed region TS, and the hard mask pattern HM also defines a recessed channel region 130.

Figure 7:
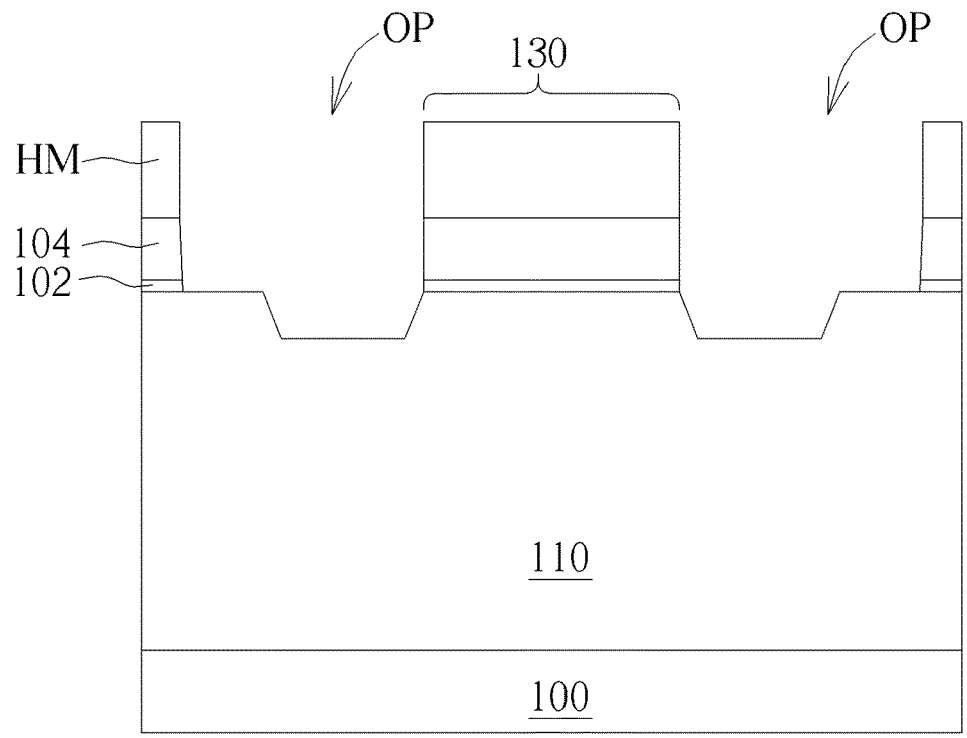

As shown in FIG. 7, an anisotropic dry etching process is performed, and the exposed silicon nitride pad layer 104 and silicon oxide pad layer 102 are etched through the opening OP of the hard mask pattern HM, thereby transferring the hard mask pattern HM to the silicon nitride pad layer 104 and the silicon oxide pad layer 102. At this point, the pre-recessed region TS is exposed.

Figure 8:
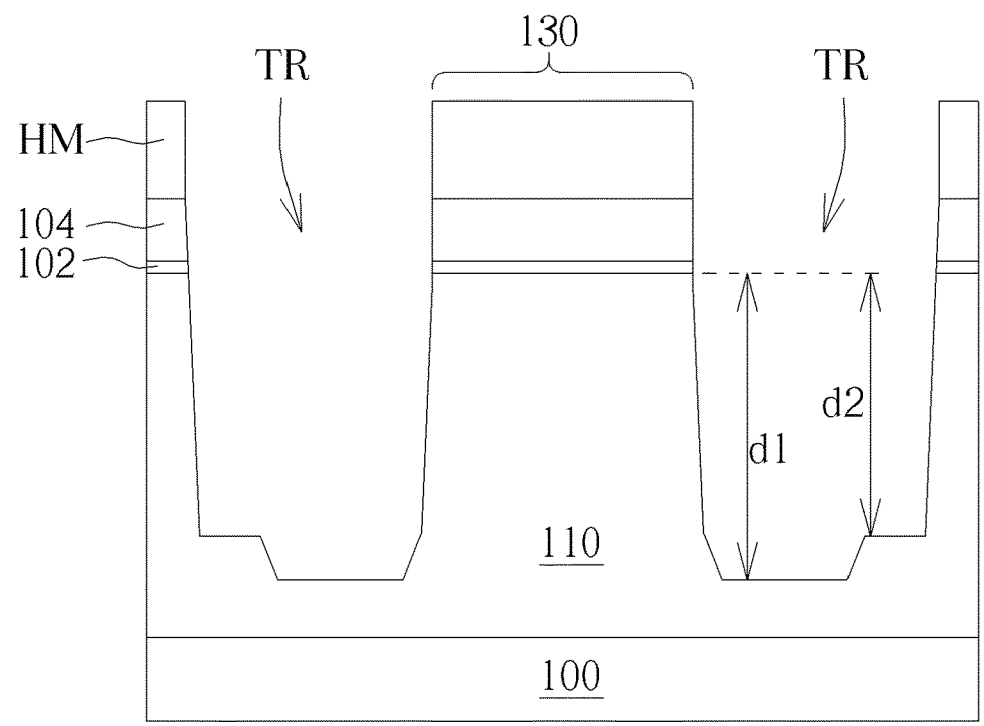

As shown in FIG. 8, the anisotropic dry etching process is continued to etch the semiconductor substrate 100 downward to form the trench TR. Because of the pre-recessed region TS, the trench TR has a first depths d1 and a second depth d2 that is different from the first depth d1, which are formed in self-aligned manner. The first depth d1 adjacent to the recessed channel region 130 is greater than the outer periphery away from the recessed channel region 130 having the second depth d2. According to an embodiment of the present invention, the difference between the first depth d1 and the second depth d2 is approximately equal to the depth h of the pre-recessed region TS, for example, 500 angstroms.

According to an embodiment of the present invention, the bottom of the trench TR have a contour similar to the pre-recessed region TS.

Figure 9:
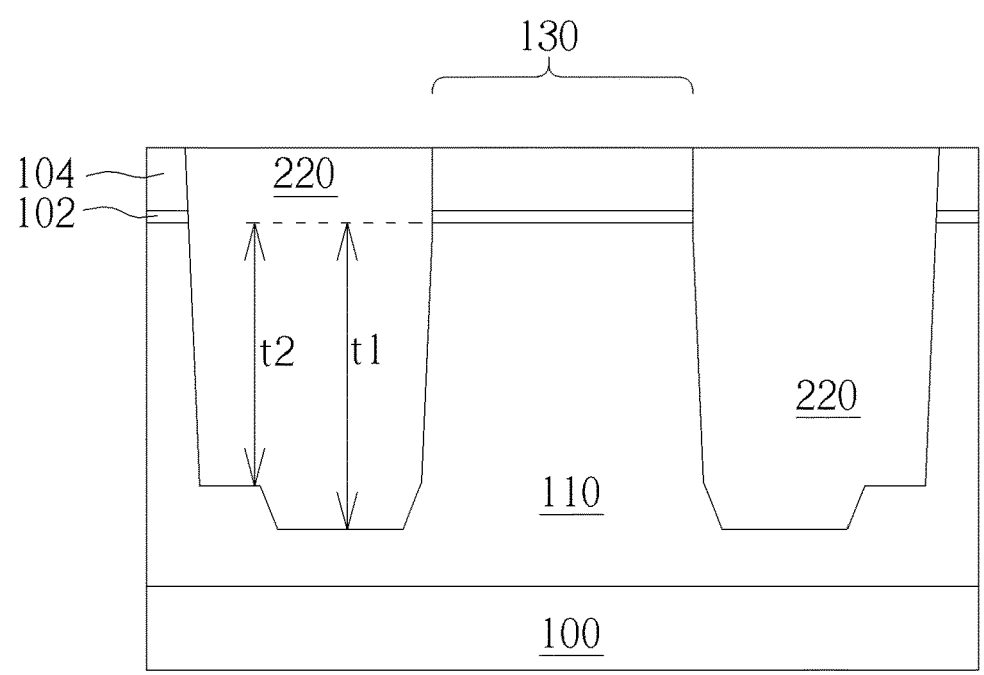

As shown in FIG. 9, next, the remaining hard mask pattern HM is removed. A shallow trench isolation process is then performed. For example, first, an insulating layer, such as a silicon oxide layer, is deposited on the semiconductor substrate 100 in a blanket manner, and the trench TR is filled with the insulating layer. Subsequently, a chemical mechanical polishing (CMP) process is performed to remove the excess insulating layer outside the trench TR. At this point, the surface of the insulating layer is substantially flush with the surface of the adjacent silicon nitride pad layer 104, thereby forming the isolation structure 220. According to an embodiment of the present invention, the isolation structure 220 has a first thickness t1 adjacent to the recessed channel region 130 and a second thickness t2 adjacent to the heavily doped region 121. The first thickness t1 is greater than the second thickness t2.

Figure 10:
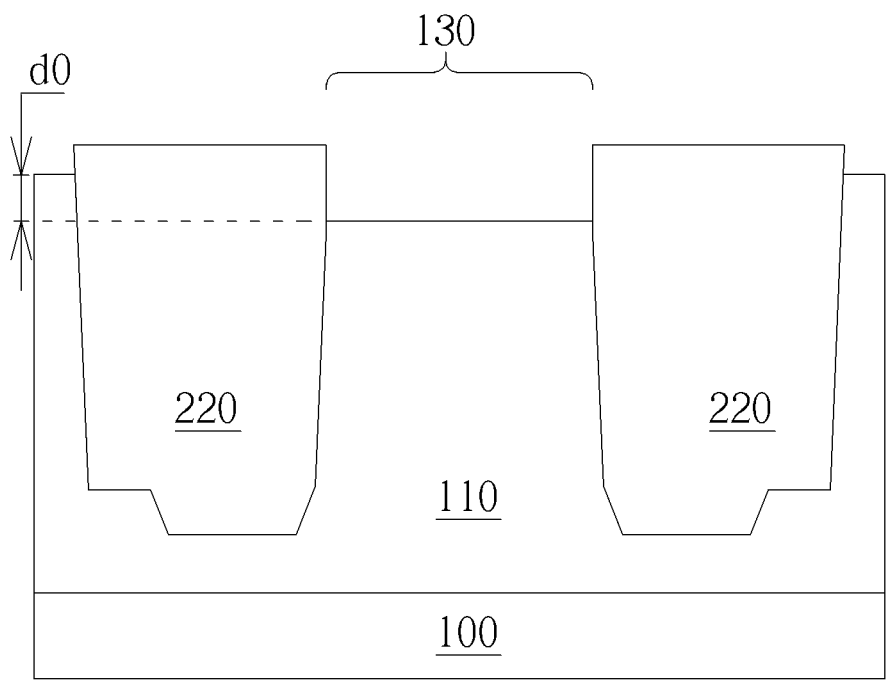

As shown in FIG. 10, next, the silicon nitride pad layer 104 and the silicon oxide pad layer 102 are removed. Subsequently, a lithography process and an etching process are performed to etch the surface of the semiconductor substrate 100 of the recessed channel region 130 so that the surface of the semiconductor substrate 100 in the recessed channel region 130 is lower than that of the surrounding regions (for example, the drain or source region) with a step height d0 of approximately, for example, 500 angstroms.

Figure 11:
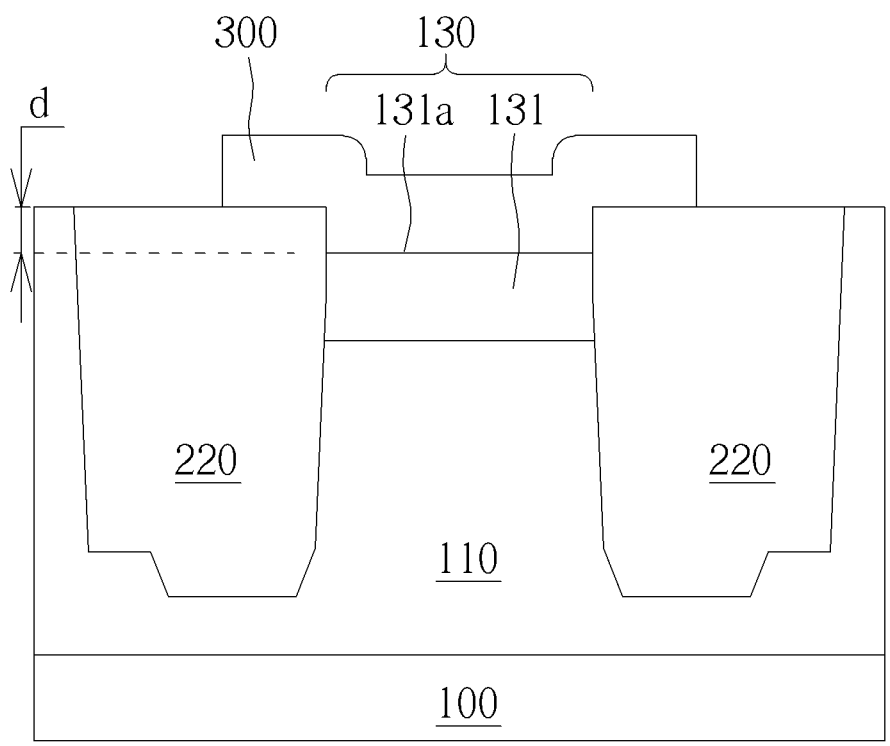

As shown in FIG. 11, an oxidation process is then performed to form a buried gate dielectric layer 131, such as a silicon dioxide layer, but is not limited thereto. According to an embodiment of the present invention, the buried gate dielectric layer 131 is a high-voltage gate oxide layer. According to an embodiment of the present invention, the isolation structure 220 is contiguous with the buried gate dielectric layer 131. According to an embodiment of the present invention, the depth d of the top surface 131a of the buried gate dielectric layer 131 below the surface of the surrounding regions (e.g., drain or source regions) of the semiconductor substrate 100 is about 500 angstroms. According to an embodiment of the present invention, a gate 300 is formed on the buried gate dielectric layer 131. The gate 300 may be a polysilicon gate, but is not limited thereto. According to an embodiment of the present invention, the gate 300 may extend to the isolation structure 220 around the recessed channel region 130.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor high-voltage device, comprising:
   a semiconductor substrate of a first conductivity type;
   a high-voltage well of the first conductivity type disposed in the semiconductor substrate;
   a drift region of a second conductivity type disposed in the high-voltage well;
   a recessed channel region disposed adjacent to the drift region;
   a heavily doped drain region of the second conductivity type disposed in the drift region and spaced apart from the recessed channel region;
   an isolation structure disposed between the recessed channel region and the heavily doped drain region in the drift region, wherein the isolation structure has a first portion having a first thickness adjacent to the recessed channel region and a second portion having a second thickness adjacent to the heavily doped drain region, and wherein the first thickness is greater than the second thickness;
a buried gate dielectric layer disposed on the recessed channel region, wherein a top surface of the buried gate dielectric layer is lower than a top surface of the heavily doped drain region, wherein a top surface of the buried gate dielectric layer is lower than a top surface of the first portion of the isolation structure adjacent to the recessed channel region; and
a gate disposed on the buried gate dielectric layer, wherein a peripheral gate portion of the gate that is directly disposed on the isolation structure has a top surface that is higher than a top surface of a portion of the gate that is disposed directly above the recessed channel region.

2. The semiconductor high-voltage device according to claim 1, wherein a depth of the top surface of the buried gate dielectric layer below the top surface of the heavily doped drain region substantially equals to a difference between the first thickness and the second thickness.

3. The semiconductor high-voltage device according to claim 2, wherein the depth of the top surface of the buried gate dielectric layer below the top surface of the heavily doped drain region is about 500 angstroms.

4. The semiconductor high-voltage device according to claim 1, wherein the isolation structure is a shallow trench isolation structure.

5. The semiconductor high-voltage device according to claim 1, wherein the isolation structure is contiguous with the buried gate dielectric layer.

6. The semiconductor high-voltage device according to claim 1, wherein the drift region partially overlaps with the buried gate dielectric layer.

7. The semiconductor high-voltage device according to claim 1 further comprising:
an annular-shaped diffusion region of the first conductivity type surrounding the drift region, the recessed channel region, and the isolation structure.

8. The semiconductor high-voltage device according to claim 1, wherein the first conductivity is P type and the second conductivity type is N type.

9. The semiconductor high-voltage device according to claim 1, wherein the buried gate dielectric layer is a high-voltage gate oxide layer.

* * * * *